(12) United States Patent
Dakhiya et al.

(10) Patent No.: US 9,155,198 B2
(45) Date of Patent: Oct. 6, 2015

(54) ELECTRONIC MODULE ALLOWING FINE TUNING AFTER ASSEMBLY (71) Applicant: Eagantu Ltd., Ra'anana (IL)

(72) Inventors: Michael Dakhiya, Tel Aviv (IL); Eran Shaked, Ra'anana (IL)

(73) Assignee: EAGANTU LTD., Ra'Anana (IL)

( * ) Notice: Subject to any disclaimer, the term of this patent is extended or adjusted under 35 U.S.C. 154(b) by 0 days.

(21) Appl. No.: 14/339,477

(22) Filed: Jul. 24, 2014

(65) Prior Publication Data

US 2014/0334120 A1    Nov. 13, 2014

Related U.S. Application Data (63) Continuation-in-part of application No. 14/251,606, filed on Apr. 13, 2014, which is a continuation-in-part of application No. PCT/IB2013/053749, filed on May 9, 2013.

(60) Provisional application No. 61/648,098, filed on May 17, 2012, provisional application No. 61/654,888, filed on Jun. 3, 2012, provisional application No. 61/670,616, filed on Jul. 12, 2012.

(51) Int. Cl.
*H05K 1/18* (2006.01)
*H05K 3/32* (2006.01)
(Continued)

(52) U.S. Cl.
CPC ............... *H05K 1/183* (2013.01); *H01L 22/14* (2013.01); *H01L 22/20* (2013.01); *H01L 23/04* (2013.01); *H01L 23/13* (2013.01); *H01L 23/5384* (2013.01); *H05K 3/32* (2013.01); *H01C 17/22* (2013.01); *H01L 23/15* (2013.01); *H01L 23/5381* (2013.01); *H01L 23/5383* (2013.01); *H01L 23/66* (2013.01); *H01L 24/16* (2013.01); *H01L 24/81* (2013.01); *H01L 25/0652* (2013.01); *H01L 25/105* (2013.01); *H01L 2223/6655* (2013.01); *H01L 2224/16225* (2013.01); *H01L 2224/8149* (2013.01); *H01L 2224/81439* (2013.01);
(Continued)

(58) Field of Classification Search
CPC ......................... H01L 23/5384; H01L 25/0652
USPC ........................................................ 361/761
See application file for complete search history.

(56) References Cited

U.S. PATENT DOCUMENTS 4,616,655 A    10/1986  Weinberg et al.
4,727,410 A *   2/1988  Higgins, III .................. 257/700
(Continued)

FOREIGN PATENT DOCUMENTS

WO    2013171636 A1    11/2013

OTHER PUBLICATIONS

Lumpp, J.K., "Hybrid Assemblies", The Electronic Packaging Handbook, CRC Press LLC, 26 pages, year 2000.
(Continued)

*Primary Examiner* — William H Mayo, III
*Assistant Examiner* — Hiram E Gonzalez
(74) *Attorney, Agent, or Firm* — D. Kligler IP Services Ltd.

(57) ABSTRACT

An electronic module includes a substrate, which includes a dielectric material having multiple sides, including first and second sides, and first and second cavities indented respectively within the first and second sides. First and second conductive contacts within the first and second cavities are configured for contact with at least first and second electronic components that are mounted respectively in the first and second cavities. Conductive traces within the substrate are in electrical communication with the first and second conductive contacts.

12 Claims, 5 Drawing Sheets

(51) Int. Cl.

| | |
|---|---|
| *H05K 1/11* | (2006.01) |
| *H01L 23/13* | (2006.01) |
| *H01L 21/66* | (2006.01) |
| *H01L 23/04* | (2006.01) |
| *H01L 23/15* | (2006.01) |
| *H01L 23/538* | (2006.01) |
| *H01L 25/065* | (2006.01) |
| *H01L 25/10* | (2006.01) |
| *H01C 17/22* | (2006.01) |
| *H01L 23/66* | (2006.01) |
| *H01L 23/00* | (2006.01) |

(52) U.S. Cl.
CPC ............ *H01L2224/81447* (2013.01); *H01L 2224/81493* (2013.01); *H01L 2225/1023* (2013.01); *H01L 2225/1047* (2013.01); *H01L 2924/14* (2013.01); *H01L 2924/1579* (2013.01); *H01L 2924/15156* (2013.01); *H01L 2924/15311* (2013.01); *H01L 2924/15313* (2013.01); *H01L 2924/15787* (2013.01); *H01L 2924/16195* (2013.01); *H01L 2924/19041* (2013.01); *H01L 2924/19042* (2013.01); *H01L 2924/19043* (2013.01); *H01L 2924/19105* (2013.01); *H01L 2924/3011* (2013.01); *H05K 2203/16* (2013.01); *H05K 2203/171* (2013.01); *Y10T 29/49004* (2015.01); *Y10T 29/4913* (2015.01); *Y10T 29/53022* (2015.01); *Y10T 29/53174* (2015.01)

(56) References Cited

U.S. PATENT DOCUMENTS

| | | | | |
|---|---|---|---|---|
| 4,792,779 | A * | 12/1988 | Pond et al. | 338/195 |
| 5,241,456 | A * | 8/1993 | Marcinkiewicz et al. | 361/792 |
| 5,598,032 | A | 1/1997 | Fidalgo | |
| 5,671,525 | A | 9/1997 | Fidalgo | |
| 5,717,245 | A | 2/1998 | Pedder | |
| 5,728,972 | A * | 3/1998 | Hsu | 174/535 |
| 5,905,635 | A | 5/1999 | Drevon et al. | |
| 5,963,429 | A | 10/1999 | Chen | |
| 5,994,648 | A * | 11/1999 | Glovatsky et al. | 174/260 |
| 6,154,371 | A | 11/2000 | Oba et al. | |
| 6,351,194 | B2 | 2/2002 | Takahashi et al. | |
| 6,480,395 | B1 | 11/2002 | Kopf | |
| 6,688,914 | B1 | 2/2004 | Espenshade et al. | |
| 6,704,207 | B2 | 3/2004 | Kopf | |
| 6,710,435 | B2 * | 3/2004 | Nagaya et al. | 257/686 |
| 6,918,297 | B2 * | 7/2005 | MacGugan | 73/504.15 |
| 7,072,185 | B1 | 7/2006 | Belady et al. | |
| 7,116,557 | B1 * | 10/2006 | Raby et al. | 361/720 |
| 7,380,337 | B2 | 6/2008 | Soeta | |
| 7,719,851 | B2 | 5/2010 | Tuominen et al. | |
| 8,569,861 | B2 | 10/2013 | O'Donnell et al. | |
| 2002/0053727 | A1 | 5/2002 | Kimura | |
| 2007/0131349 | A1 | 6/2007 | Tuominen et al. | |
| 2008/0117608 | A1 | 5/2008 | Seo et al. | |
| 2009/0279268 | A1 | 11/2009 | Son | |
| 2010/0231199 | A1 | 9/2010 | Peschke et al. | |
| 2011/0203831 | A1 * | 8/2011 | Schmidt et al. | 174/126.2 |
| 2012/0104623 | A1 | 5/2012 | Pagaila et al. | |
| 2014/0026649 | A1 | 1/2014 | O'Donnell et al. | |
| 2014/0218883 | A1 | 8/2014 | Dakhiya et al. | |

OTHER PUBLICATIONS

International Application # PCT/IB2013/053749 Search Report dated Sep. 11, 2013.

ASE Group, "SIP Module", p. 1, year 2012 (http://www.aseglobal.com/en/index_detail.aspx?id=6).

The Nordic Electronics Packaging Guideline, 4 pages, year 2000 (http://www.extra.ivf.se/ngl/).

* cited by examiner

ELECTRONIC MODULE ALLOWING FINE TUNING AFTER ASSEMBLY

CROSS-REFERENCE TO RELATED APPLICATIONS

This application is a continuation-in-part of U.S. patent application Ser. No. 14/251,606, filed Apr. 13, 2014, which is a continuation-in-part of PCT Patent Application PCT/IB2013/053749, filed May 9, 2013, which claims the benefit of U.S. Provisional Patent Application 61/648,098, filed May 17, 2012; U.S. Provisional Patent Application 61/654,888, filed Jun. 3, 2012; and U.S. Provisional Patent Application 61/670,616, filed Jul. 12, 2012. All of these related patent applications are incorporated herein by reference.

FIELD OF THE INVENTION

The present invention relates generally to electronic circuits and systems, and particularly to assembly of integrated circuits and other components in such circuits and systems.

BACKGROUND

Modern electronic devices contain ever larger numbers of components and increasing degrees of complexity. At the same time, designers are required to fit these components into ever smaller end-products.

These conflicting demands have led to the development of highly-integrated approaches to chip design and packaging. For example, multi-chip modules (MCMs) typically contain multiple integrated circuits (ICs) or semiconductor dies, and possibly discrete components, as well, on a unifying substrate. The MCM can then be assembled as a single component onto a printed circuit board. Some advanced MCMs use a "chip-stack" package, in which semiconductor dies are stacked in a vertical configuration, thus reducing the size of the MCM footprint (at the expense of increased height). Some designs of this sort are also referred to as a "system in package."

Although IC chips are usually mounted on the surface of an MCM or printed circuit substrate, in some designs an IC may be mounted in a recess in the substrate. For example, U.S. Pat. No. 7,116,557 describes an imbedded component integrated circuit assembly, in which IC components are imbedded within a laminate substrate disposed on a thermally conductive core, which provides a thermal sink. The circuit components are electrically connected to the IC via flexible electrical interconnects, such as flexible wire bonds. An electrically-insulating coating is deposited upon the flexible electrical interconnects and upon the exposed surfaces of the integrated circuit assembly. A thermally-conductive encapsulating material encases the circuit components and the flexible electrical interconnects within a rigid or semi-rigid matrix.

As another example, U.S. Patent Application Publication 2009/0279268 describes a module that includes a first module unit provided at a top surface with a cavity and a second module unit on which one or more electronic devices are mounted. The second module unit is at least partly received in the cavity of the first module unit. The cavity may be formed in a dual-step structure.

U.S. Patent Application Publication 2012/0104623 provides another example, in which a semiconductor substrate has a plurality of different size recesses formed in the substrate to provide a stepped interposer. A conductive via can be formed through the stepped interposer. A first semiconductor die is partially disposed in a first recess, and a second semiconductor die is partially disposed in a second recess. The first semiconductor die is electrically connected to the second semiconductor die through a conductive layer.

Some electrical devices are designed to be trimmed after assembly, for example by removing material from a thick-film resistor with a laser until the desired resistor value is achieved. (A notch cut in the resistor by the laser decreases the width of the film and thereby increases the resistor value.)

In this regard, for instance, U.S. Pat. No. 5,717,245 describes a ball grid array arrangement comprising a dielectric multilayer substrate, in a lower metallization layer of which is disposed an array of solder balls. A passive circuit element is integrated into at least one of the metallization layers. The arrangement may take the form of an IC carrier or multichip-module carrier having transmission structures situated within a central die-attach area of the substrate and having also a peripheral area containing bonding structures for the mounting of at least one chip or chip module. A passive circuit element in the form of an inductor may be formed in the upper metallization layer between adjacent groups of bonding structures. In order to achieve tighter tolerances, a combination of triplate and surface microstrip constructions may be employed to allow trimming and tuning of these components after manufacture, by arranging for the majority of the length of a resonator or filter element to be defined in the triplate format described above, but completing the length with the addition of a short length of microstrip formed in the upper or lower metallization. Laser or abrasive trimming may be employed to adjust the length and resonant behavior of the line.

SUMMARY

Embodiments of the present invention that are described hereinbelow provide a novel three-dimensional (3D) design approach for electronic integration.

There is therefore provided, in accordance with an embodiment of the present invention, an electronic module, which includes a substrate including a dielectric material having multiple sides, including first and second sides, and first and second cavities indented respectively within the first and second sides. First and second conductive contacts within the first and second cavities are configured for contact with at least first and second electronic components that are mounted respectively in the first and second cavities. Conductive traces within the substrate are in electrical communication with the first and second conductive contacts.

In some embodiments, the second side is parallel to and opposite the first side, whereby the first and second cavities open in mutually-opposing directions. The substrate may have a third side, non-parallel to the first and second sides, with a third cavity indented within the third side, wherein the module includes third conductive contacts within the third cavity for contact with at least a third electronic component that is mounted in the third cavity. Alternatively, the second side may be non-parallel to the first side.

In a disclosed embodiment, the module includes a plurality of contact pads disposed on at least two different exterior surfaces of the substrate and connected to the conductive traces, wherein the contact pads are configured for contacting at least one of a printed circuit board and another module.

In the disclosed embodiments, the substrate includes multiple layers of the dielectric material, which are graduated in size and include at least one layer having a central opening, and the layers are joined together so as to define the cavities in the substrate.

Optionally, one or more of the conductive traces and contacts include graphene.

In some embodiments, the module includes a trimmable conductive element formed on a surface of the substrate in proximity to at least one of the cavities, wherein the trimmable conductive element is connected to the conductive traces so as to define an electrical circuit that includes the first and second electronic components and the trimmable conductive element.

There is also provided, in accordance with an embodiment of the present invention, a method for producing an electronic module. The method includes providing a substrate including a dielectric material having a cavity formed therein and conductive contacts within the cavity, a trimmable conductive element formed on a surface of the substrate in proximity to the cavity, and conductive traces within the substrate so as to define an electrical circuit that includes the conductive contacts and the trimmable conductive element. An electronic component is mounted within the cavity in contact with the conductive contacts. The trimmable conductive element is trimmed so as to adjust an electrical property of the circuit including the electronic component that is mounted within the cavity.

In some embodiments, the cavity is indented within a first side of the substrate, and the surface on which the trimmable conductive element is formed is located on a second side of the substrate, different from the first side.

In a disclosed embodiment, trimming the trimmable conductive element includes measuring a frequency response of the circuit, and removing material from the trimmable conductive element until the measured frequency response meets a predefined specification. Measuring the frequency response may include, after the electronic module has been assembled, mounting the electronic module on a test fixture, which is connected to a measurement circuit for measuring the frequency response of the circuit while removing the material from the trimmable conductive element.

Additionally or alternatively, trimming the trimmable conductive element includes measuring an impedance of the circuit, and removing material from the trimmable conductive element until the measured impedance meets a predefined specification.

In one embodiment, providing the substrate includes connecting together first and second dielectric substrates, wherein the trimmable conductive element is formed on the surface of the first dielectric substrate, while the electrical circuit includes at least one electronic component that is mounted on the second dielectric substrate.

In another embodiment, providing the substrate includes embedding an array of circuit components in the substrate, and trimming the trimmable conductive element includes disconnecting one or more of the circuit components from the array.

Optionally, providing the electronic module includes embedding one or more discrete circuit components within the dielectric substrate, and trimming the trimmable conductive element includes adjusting a value of at least one of the embedded components.

There is additionally provided, in accordance with an embodiment of the present invention, a method for producing an electronic module. The method includes providing a substrate including a dielectric material having multiple sides, including first and second sides, and first and second cavities indented respectively within the first and second sides, the substrate having first and second conductive contacts within the first and second cavities and conductive traces within the substrate in electrical communication with the first and second conductive contacts. At least first and second electronic components are mounted in the first and second cavities, respectively, in contact with the first and second contacts.

There is further provided, in accordance with an embodiment of the present invention, a system for producing electronic devices. The system includes a module, which includes a substrate including a dielectric material having a cavity formed therein and conductive contacts within the cavity. A trimmable conductive element is formed on a surface of the substrate in proximity to the cavity. Conductive traces within the substrate define an electrical circuit that includes the conductive contacts and the trimmable conductive element. An electronic component within the cavity is in contact with the conductive contacts. A test fixture is configured to hold the module. A trimming device is configured to trim the trimmable conductive element on the module held by the mount so as to adjust an electrical property of the circuit including the electronic component that is mounted within the cavity.

The system may include a measurement circuit, which is configured to measure a frequency response and/or an impedance of the electrical circuit while the module is held by the test fixture.

The present invention will be more fully understood from the following detailed description of the embodiments thereof, taken together with the drawings in which:

DETAILED DESCRIPTION OF EMBODIMENTS

Overview

The above-mentioned PCT Patent Application PCT/IB2013/053749 describes new types of electronic modules that enable multiple IC chips and other components to be mounted together with high component density in a three-dimensional (3D) assembly. The electronic module comprises a dielectric substrate, such as a suitable laminate or ceramic, having one or more cavities. (This sort of substrate with one or more cavities is equivalently referred to herein as a "frame.") Conductive contacts within and around the cavity permit electronic components, which may be discrete components or ICs, as well as microelectromechanical, optical and other multifunctional parts, to be mounted on the surface of the substrate within and over the cavity. The cavity may have two or more nested layers, thus allowing components to be mounted at three or more levels. Discrete components may also be embedded in the substrate itself.

Conductive traces within the substrate connect to the conductive contacts on the surface of the substrate (within and on the surface surrounding the cavity). The traces can be laid out as desired to provide the appropriate connections between the components, as well as to contact pads on the outer surface of the substrate. These outer contact pads can be used to mount the module on a printed circuit board, as well as to connect multiple modules together into a larger assembly.

In some embodiments of the present invention, which are described further hereinbelow, the substrate has multiple sides, which respective cavities indented within two or more different sides. Conductive contacts within the cavities and traces within the substrate are configured so that electronic components may be mounted in the various cavities on the different sides. The cavities may be formed in opposite sides of the substrate, so that the cavities open in mutually-opposing directions. Additionally or alternatively, the cavities may be formed in sides of the substrate that are not parallel to one another, so that one cavity opens upward (relative to the surface on which the module is to be mounted), for example, while another opens sideways. The cavities may be formed in sides of the substrate that are perpendicular or that are oriented obliquely (neither parallel nor perpendicular) to one another. This latter sort of design may be implemented, for example, using 3D printing technology.

Module designs in accordance with embodiments of the present invention are advantageous, inter alia, in minimizing the use of wire bonding in connecting IC components, which can add parasitic inductance. Even using such modules, however, it may still be difficult in many cases to obtain the precise desired electrical circuit characteristics, due to manufacturing tolerances of discrete components, such as capacitors, inductors and resistors. Furthermore, parasitic capacitance and inductance of circuit components may be difficult to control even in well-designed modules.

To overcome these difficulties, module frame designs in accordance with embodiments of the present invention may allow trimming of individual components and of the entire assembled module. Such trimming is useful in adjusting both specific component values and overall module performance. For this purpose, in some embodiments, a trimmable conductive element is formed on a surface of the substrate in proximity to one of the cavities. The conductive traces within the substrate define an electrical circuit that comprises the trimmable conductive element and one or more electronic components that are mounted within the cavity. The trimmable conductive element is trimmed, by laser cutting, for example, or other techniques that are known in the art, so as to adjust an electrical property of the circuit. Trimming can be performed in conjunction with measurement of circuit properties after the module has been assembled, thus enabling precise overall tolerances to be met (coupled with high Q-factors) even when the components in the module themselves have poor tolerances. The design and trimming techniques provided by embodiments of the present invention can be applied in substantially any type of electronic module, but they are particularly useful in construction of various types of radio-frequency (RF) circuits, such as filters, baluns and transformers.

For effective control of circuit properties, it is generally desirable that the trimmable conductive element be located in close proximity to the other components of the circuit. The multi-sided design of the module can be useful in this regard, since it allows the trimmable conductive element to be formed either on the same side or on a different side of the substrate from that in which the cavity is indented, in a manner that shortens the length of the traces between the parts of the circuit. This approach is beneficial in maintaining tight circuit tolerances by minimizing parasitic capacitance and inductance. It can also reduce energy loss and reduce propagation time of signals passing through these traces.

Example Module Designs

Figure 1A:
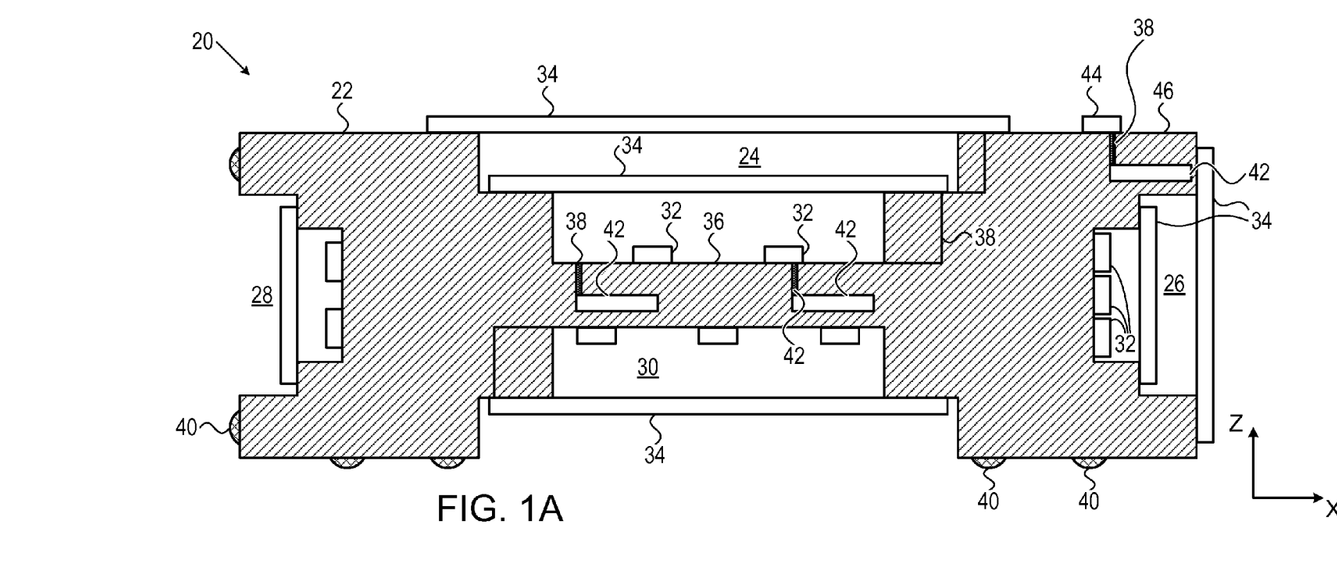
FIG. 1A is a schematic sectional illustration of a multi-level electronic module, in accordance with an embodiment of the present invention.
Figure 2A:
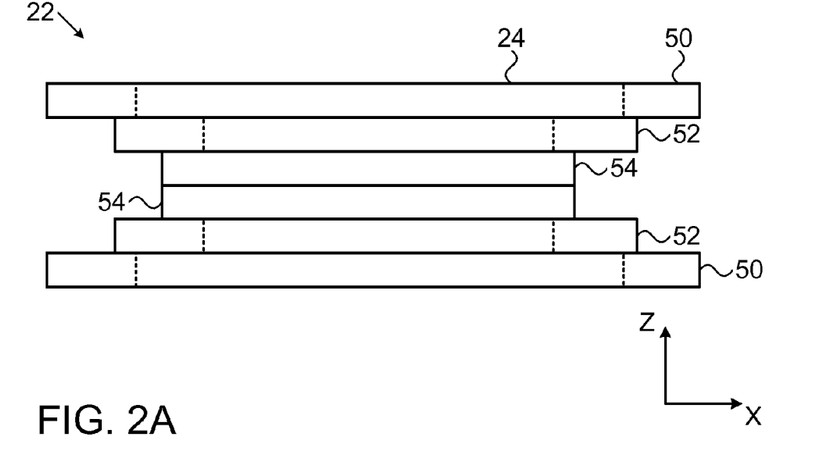
FIGS. 2A and 2B are schematic side and top views, respectively, of a multi-level electronic module, in accordance with an embodiment of the present invention.
Figure 2B:
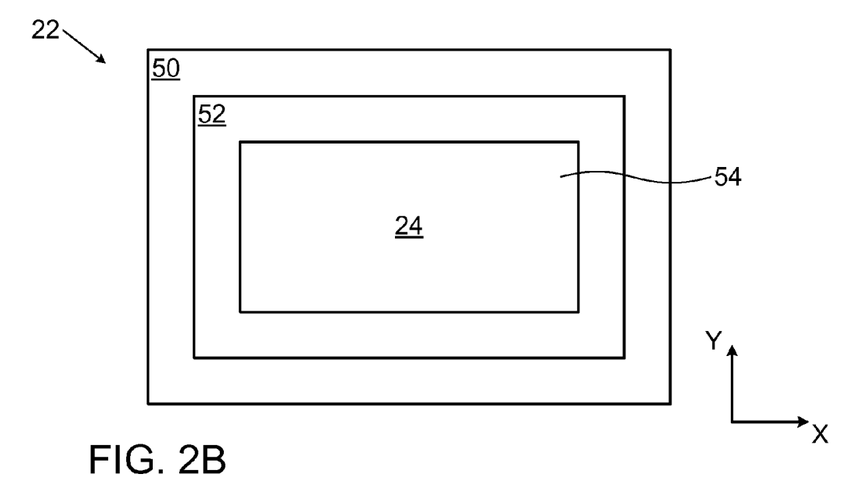

FIG. 1A is a schematic sectional illustration of a multi-level electronic module 20, in accordance with an embodiment of the present invention. The module is built on a dielectric substrate 22, which may be made from multiple layers, as shown in FIGS. 2A and 2B, for example. For convenience in the following description, FIG. 1 shows a set of Cartesian axes, with the X- and Z-directions running in the plane of the figure, while the Y-direction runs perpendicular to these axes, pointing into the page.

Cavities 24, 26, 28 and 30 are formed in different sides of substrate 22. Cavities 24 and 30, for example, are formed in opposing sides of the substrate, both in X-Y planes, and thus open in mutually-opposing directions. Cavities 26 and 28 are formed in opposing sides of substrate in Y-Z planes, perpendicular to the sides in which cavities 24 and 30 are formed. The cavities shown in FIG. 1A are nested, meaning that each is made up of an outer cavity and a nested inner cavity within the outer cavity. The particular geometry of module 20 is shown solely by way of example, and modules having alternative geometries are shown in other figures that are described hereinbelow, as well as in the above-mentioned PCT patent application, which also describes further aspects of the structure and fabrication of such modules.

Substrate 22 may comprise any suitable electrically-insulating material. For example, LTCC (ceramic) provides excellent heat transfer and thus facilitates cooling of the components, whereas a laminate is particularly cost-effective in producing multilayer structures. Alternatively, an elastic polymer may be used to provide improved absorption of mechanical vibrations, or other suitable dielectric materials that are known in the art may be chosen depending on system requirements.

Electronic components are mounted in a 3D array in module 20. Components 32 (which may typically be discrete components or ICs) are mounted on the surface of substrate 22 within cavities 24, 26, etc. Other components 34, such as ICs, may be mounted over the cavities, on the surface of the substrate that surrounds the cavity. The ICs and discrete components in module 20 may be contained in chip-scale or flip-chip packages or may be assembled as bare dies. The 3D structure of module 20 makes it possible to position each IC, as well as other components, in the most advantageous location and orientation. (For example, opto-electronic chips, such as image sensors, may be placed on multiple sides of the module to facilitate multi-directional sensing that does not require movement of the module.) Some discrete components 42 can be also embedded in substrate 22, as explained in the above-mentioned PCT patent application.

The electronic components mounted on and in module are connected by conductive traces running on and through substrate 22. These traces typically include vias 38, which pass through substrate 22 in a direction perpendicular to the surfaces in and surrounding the cavities on which the components are mounted (for example, in the Z-direction), as well as conductive contacts and lines 36 disposed in planes (for example, X-Y planes) that are parallel to the component mounting surface. The conductive traces and contacts may be produced using standard silver printing or photochemical techniques for copper, or they may, alternatively or additionally, comprise other metals, as well as conductive polymers and adhesives. Alternatively or additionally, advanced materials, such as graphene, may be used in conductive traces, contacts and vias. The use of such materials will further improve the energy efficiency at the entire module.

Module 20 is configured for mounting on a larger underlying substrate, such as a printed circuit board (PCB), using contact pads 40 on the exterior surfaces of substrate 22. Alternatively or additionally, contact pads 40 may be used for connecting module 20 to other modules, as shown, for example, in FIG. 5. External contact pads 40 may be of any suitable type, such as ball grid array (BGA), land grid array (LGA), or surface mounted device (SMD) contacts. As shown in FIG. 1A, contact pads 40 may be located on any side of substrate 22, and possibly on multiple different sides. Typically, contacts 40 are connected to the electronic components in module 20 by conductive lines 36 and vias 38.

A trimmable conductive element 44 is formed on an outer surface 46 of substrate 22 and is connected by conductive traces (such as via 38) within the substrate to circuit components mounted on and/or embedded in the substrate. Trimmable element 44 may thus be part of an electrical circuit that comprises certain components 32 and/or 34 that are mounted within one or more of the cavities in substrate 22. The specific location of component 44 in FIG. 1A, for example, is advantageous for coupling to components 32 and 34 in cavity 26—which is formed in a side of substrate 22 that is perpendicular to surface 46—since the connecting traces will be relatively short.

As described further hereinbelow, after assembly of module 20, the characteristics of a circuit in the module may be measured. A laser or other suitable precision device may then remove sufficient material from component 44 to modify the component value so as to give the desired operating properties of the circuit at the design frequency of the module. For example, in producing filters and multiplexers, insertion loss and rejection in specified frequency bands may be measured, and electromagnetic stimulation may be applied to the circuit (as is known in the art) in order to calculate the required trimming values. This process may be repeated iteratively until the precise, desired performance parameters are achieved. Similar techniques may be used in modules of other types. Some specific examples are presented hereinbelow.

Figure 1B:
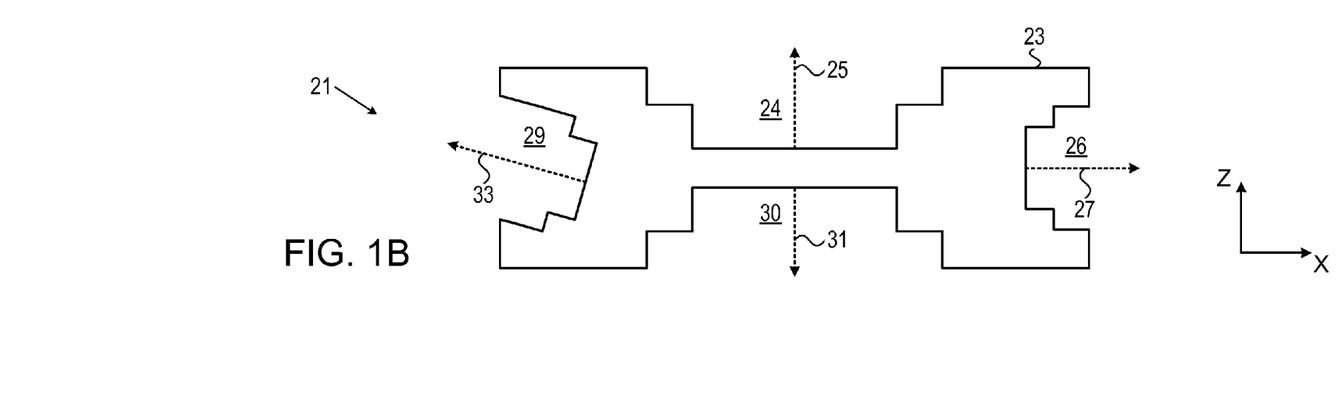
FIG. 1B is a schematic sectional illustration of a multi-level electronic module, in accordance with another embodiment of the present invention.

FIG. 1B is a schematic sectional illustration of a multi-level electronic module 21, in accordance with an alternative embodiment of the present invention. Cavities 24, 26 and 30 are in mutually parallel or perpendicular sides of a substrate 23 of module 21, as indicated by respective normals 25, 27 and 31. Substrate 23 has a further side cavity 29, however, that is oriented obliquely relative to the other sides, as illustrated by a corresponding normal 33. As noted earlier, this sort of substrate can be manufactured, for example, by a 3D printing process. In other respects, module 21 may have similar components and characteristics to those of module 20, as described above.

FIGS. 2A and 2B are schematic side and top views, respectively, of substrate 22 in a multi-level electronic module, such as module 20, in accordance with an embodiment of the present invention. Substrate 22 in this example is a laminate made up of multiple layers 50, 52, 54. Each layer typically comprises conductive traces (not shown in these figures), such as lines 36 formed on its surface and vias 38 passing through the layer. Alternatively, layers 50, 52 and 54 may comprise other dielectric materials, such as a ceramic material, which are joined together, for example by stacking and then sintering the ceramic layers. Layers 50 and 52 in this example are graduated in size, relative to layer 54, and one or more of layers 50 and 52 (or in the present case, both layers) have central openings. Thus, when the layers are overlaid as shown in FIGS. 2A and 2B, the openings in layers 50 and 52 define cavities 24 and 30, within which circuit components may be mounted. At the same time the graduated sizes of the layers cause cavities 26 and 28 to be defined at the sides of substrate 22 (in the Y-Z planes). Other components may be mounted on the surfaces within these cavities, at the edges of layers 52 and 54, as shown in FIG. 1A.

Modules with Trimmable Components and Circuit Parameters

Figure 3:
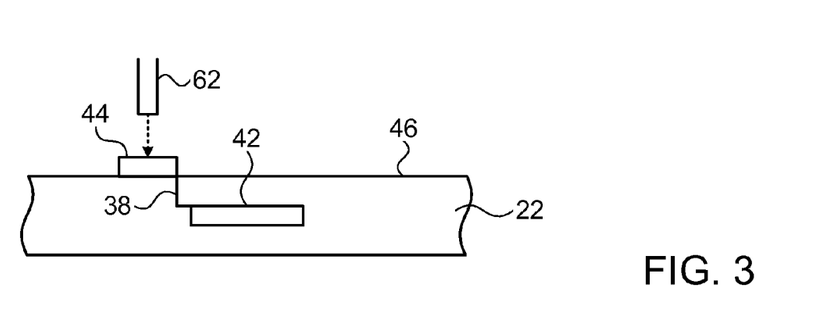
FIG. 3 is a schematic sectional illustration of an electronic module, showing laser trimming of an embedded circuit component, in accordance with an embodiment of the present invention.

FIG. 3 is a schematic sectional illustration of an electronic module, showing laser trimming of an embedded circuit component, in accordance with an embodiment of the present invention. Substrate 22 in this embodiment is a multi-layer structure, which contains a circuit comprising embedded component 42, formed on an inner layer surface of the substrate, and outer trimmable conductive element 44, such as a conductive plate. Element 44 is formed on upper surface 46 of the substrate to enable trimming and is connected to the other component(s) of the circuit by via 38. The characteristics of the circuit are measured, and a laser 62 (or other trimming device) removes sufficient material from element 42 to reach the appropriate component values and thus give the desired operating properties at the design frequency of the module. Similar techniques may be used in modules of other types.

Figure 4:
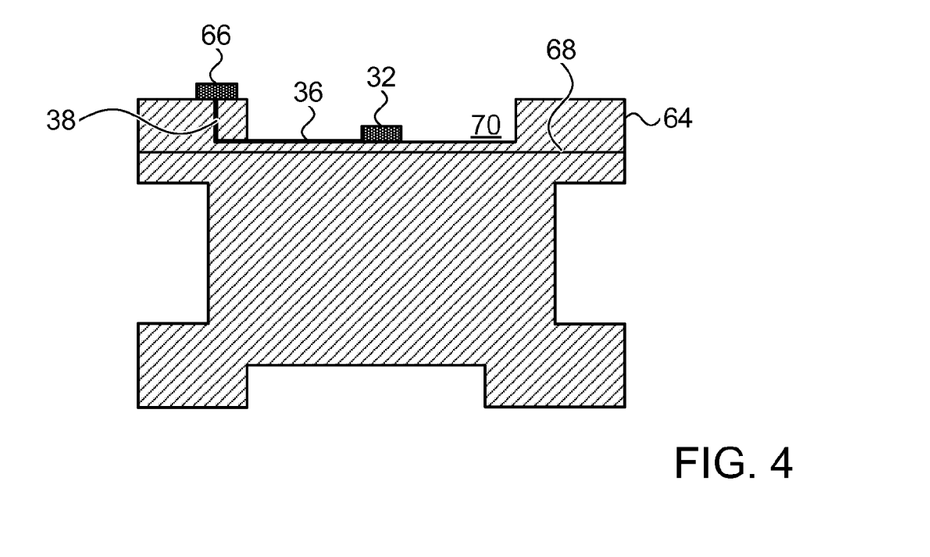
FIG. 4 is a schematic sectional view of an electronic module with a trimmable component, in accordance with an embodiment of the present invention.

FIG. 4 is a schematic sectional view of a multi-level electronic module with a trimmable component 66 mounted on an outer surface of a substrate 64, in accordance with another embodiment of the present invention. The circuit in this case comprises component 66, along with component 32 mounted in a cavity 70 and connected to component 66 by line 36 and via 38. Substrate 64 contains an internal ground plane 68, and the circuit is designed to provide a certain target impedance, for example 50Ω. Via 38 in this design is short and separate from ground plane 68. After fabrication of the circuit, its impedance is measured, and component 66 is trimmed until the precise target impedance is reached.

Figure 5:
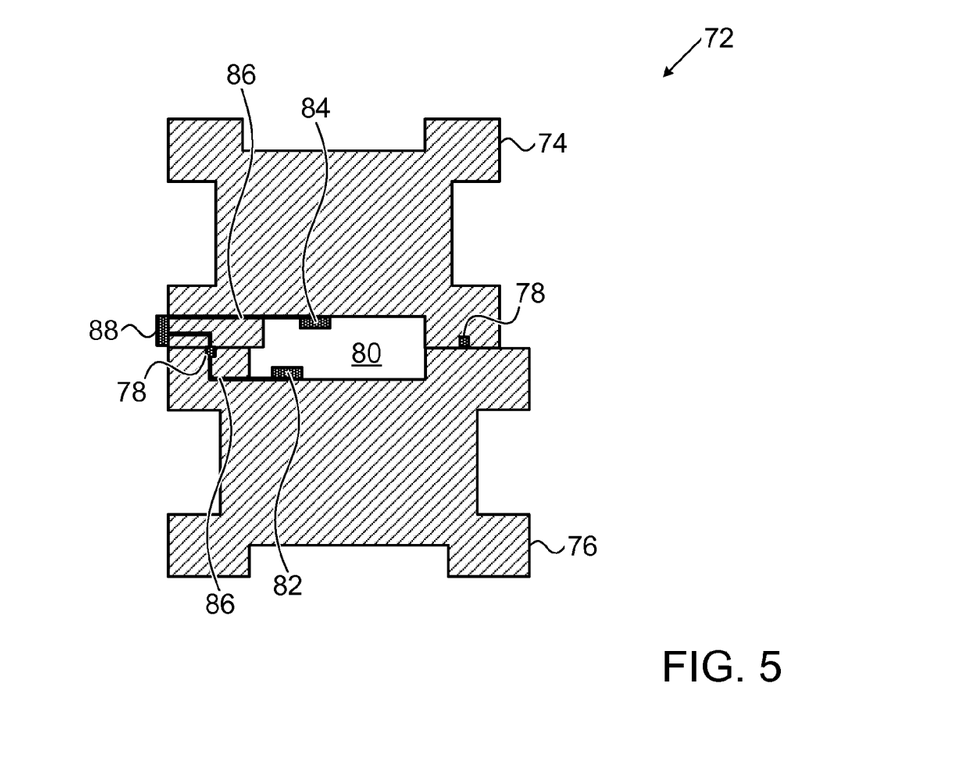
FIG. 5 is a schematic sectional view of an electronic module with a trimmable component, in accordance with another embodiment of the present invention.

FIG. 5 is a schematic sectional view of a multi-level electronic module 72 with a trimmable component 88, in accordance with another embodiment of the present invention. Module 72 is made up of two substrates 74 and 76, which are joined together by electrical contacts 78 to define an inner cavity 80. Prior to joining the substrates together, circuit components 82 and 84 are mounted inside the cavity on substrates 74 and 76, respectively. Components 82 and 84 are connected by conductive traces 86 to trimmable component 88 on substrate 74. After assembly of module 72, component 88 is trimmed, as explained above, in order to adjust the circuit parameters. In this embodiment, in other words, the single trimmable component on substrate 74 can be trimmed to correct for the tolerance of component 82, on substrate 76, i.e., on a different substrate, as well as for the tolerance of component 84.

Figure 6:
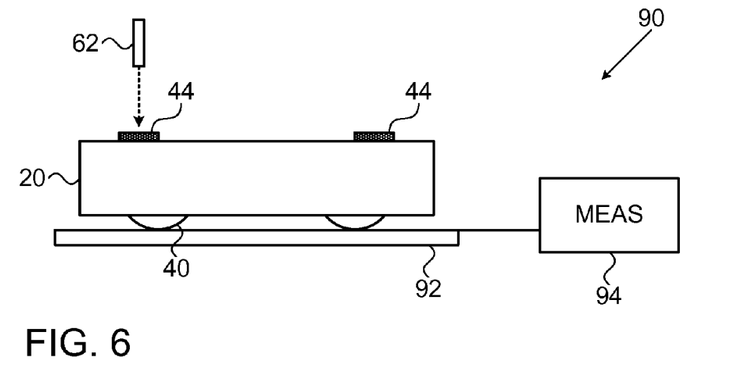
FIG. 6 is a schematic side view of a system for controlled trimming of an electronic module, in accordance with an embodiment of the present invention.

FIG. 6 is a schematic side view of a system 90 for controlled trimming of electronic module 20, in accordance with an embodiment of the present invention. This figure illustrates an advantageous mode of production and use of modules produced in accordance with embodiments of the present invention: It enables "known good modules" to be fully assembled, tested, and trimmed before they are assembled into the target product. For this purpose, module 20 is mounted on a test fixture 92, which is connected to a measurement circuit 94 (such as a network analyzer, for example). Circuit 94 measures the properties of module 20, such as its frequency response, and laser 62 trims one or more trimmable components 44 until the properties are found to meet the design specifications.

Although the embodiments described herein make use mainly of laser trimming, any other suitable mechanical or chemical technology allowing partial removal of trimmable components can be applied alternatively or additionally.

Design of Trimmable Structures and Circuits

Figure 7A:
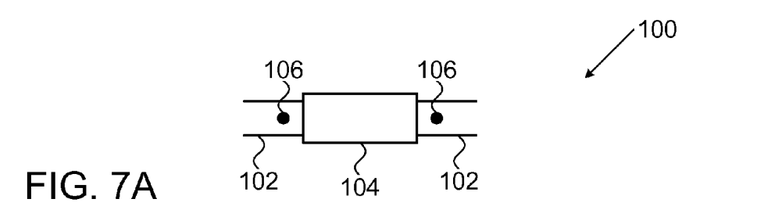
FIGS. 7A and 7B are schematic top views of trimmable corrective elements in an electronic module, in accordance with an embodiment of the present invention.

FIG. 7A is a schematic top view of a trimmable corrective element 100 in an electronic module, in accordance with an embodiment of the present invention. A trimmable component 104, such as a metal plate on the surface of the module substrate, is connected to conductive traces 102 on the module surface. Measurement probes may contact traces 102 at test points 106 on either side of component 104 in order to measure the component parameters, such as resistance, capacitance, and/or inductance, of element 100. These specific, local measurements may be made in addition to or instead of the module measurements that are made in the sort of test system that is shown in FIG. 6.

Figure 7B:
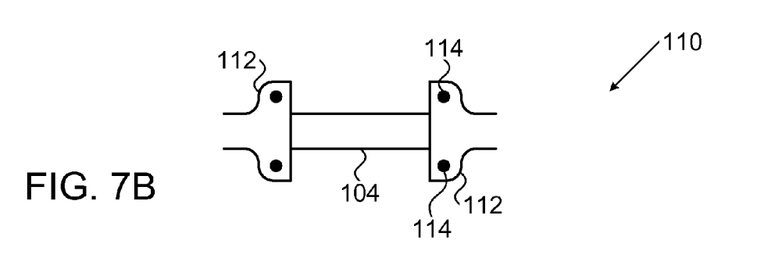

FIG. 7B is a schematic top view of a trimmable corrective element 110 in an electronic module, in accordance with another embodiment of the present invention. In this case, test points 114 are provided on special, broader contact pads 112 that are formed on either side of trimmable component 104.

Figure 8:
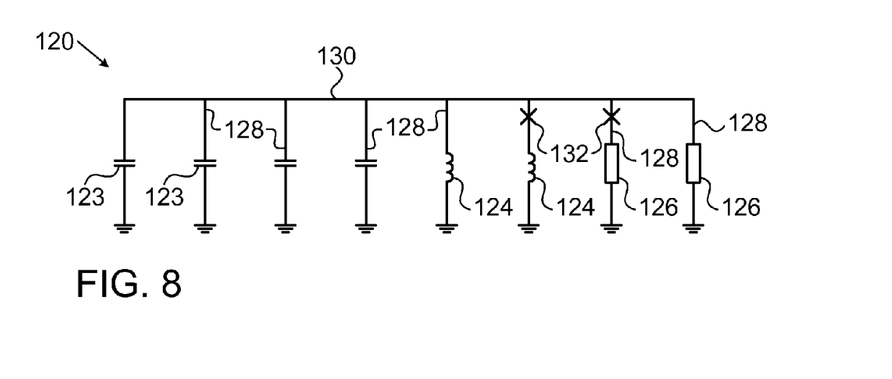
FIG. 8 is a schematic circuit diagram of a trimmable array of embedded components, in accordance with an embodiment of the present invention.

FIG. 8 is a schematic circuit diagram of a trimmable array 120 of embedded components, in accordance with an embodiment of the present invention. Array 120 in this example comprises one or more capacitors 123, inductors 124 and/or resistors 126, which may be formed on the surface or embedded in the substrate of a module. These components are connected by respective fusible links 128 to a device bus 130. Links 128 and bus 130 typically comprise conductive traces formed on the surface of and/or as vias passing through the layers of the substrate.

Each link 128 typically comprises at least one segment that is exposed on the outer surface of the substrate. These segments can be located on any side of the substrate, in locations chosen so as to minimize trace lengths and facilitate access by a trimming device, such as a laser, as explained above. In order to adjust the electrical parameters of array 120, the laser cuts certain links 128 as appropriate, creating disconnects 132 between the corresponding components and bus 130. This sort of discrete component trimming can be used instead of or in conjunction with the graduated removal of material from corrective elements that was described in reference to the preceding embodiments.

Figure 9:
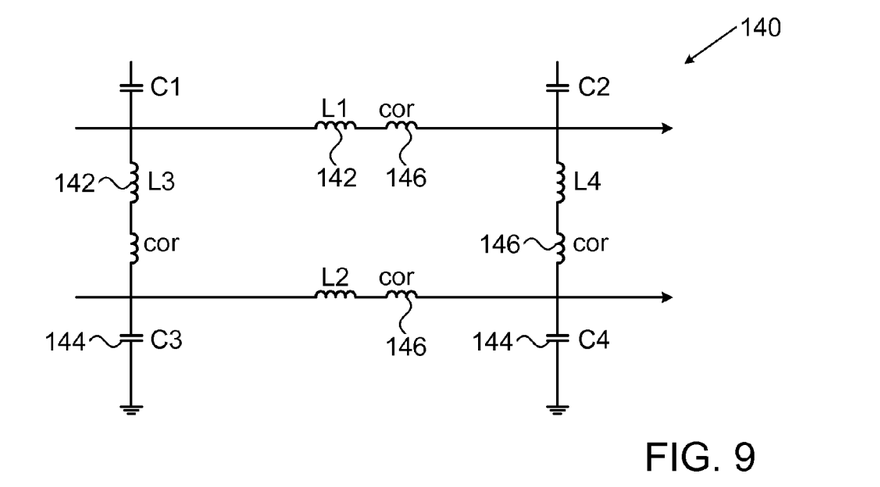
FIG. 9 is a schematic circuit diagram of a trimmable quadrature splitter, in accordance with an embodiment of the present invention.

FIG. 9 is a schematic circuit diagram of a trimmable quadrature splitter 140 that is integrated in an electronic module of the type described above, in accordance with an embodiment of the present invention. Splitter 140 comprises inductors 142 (marked L1-L4) and capacitors 144 (marked C1-C4) in a typical bridge configuration. For optimal performance with high Q-factor, it is desirable that inductors 142 comprise wire-wound components. Such inductors, however, are known to have unacceptably wide tolerance, typically around 10%. To overcome this difficulty, corrective inductive elements 146 are formed on the module surface in series with inductors 142. After assembly of splitter 140, elements 146 are trimmed, typically by laser as described above, in order to obtain the desired circuit performance.

Figure 10:
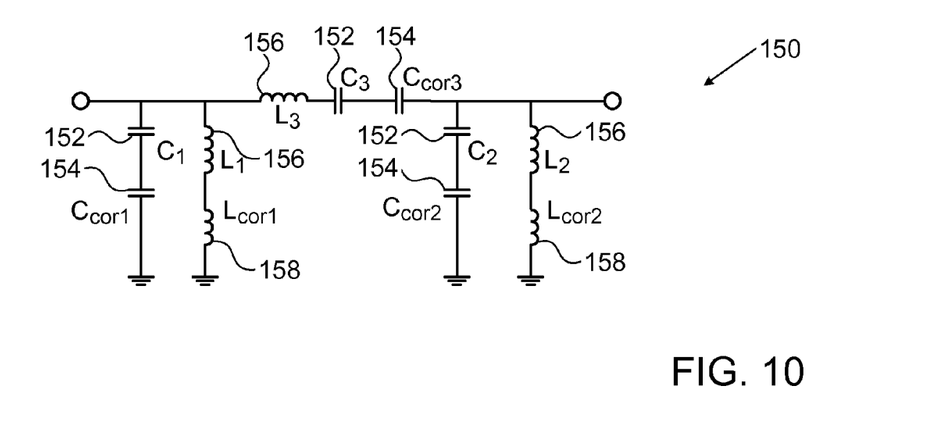
FIG. 10 is a schematic circuit diagram of a trimmable bandpass filter, in accordance with an embodiment of the present invention.

FIG. 10 is a schematic circuit diagram of a trimmable bandpass filter 150 that is integrated in an electronic module of the type described above, in accordance with another embodiment of the present invention. Filter 150 comprises capacitors 152 (C1-C3) and inductors 156 (L1-L3) in a standard circuit configuration. For a filter operating in the 2 GHz range, for example, capacitors C1 and C2 may comprise discrete LTCC capacitors, while inductors L1-L3 comprise discrete wire-wound inductors, as in the preceding embodiment. The capacitors have tolerances in the 5% range, while the tolerance of the inductors may be as high as 10%, as noted above. Capacitor C3, on the other hand, typically has a very small value, in the range of 0.05 pF and may comprise a pair of parallel metal plates formed on or in the dielectric substrate of the module.

To permit adjustment of the frequency characteristics of filter 150, while maintaining a high Q-factor, corrective capacitive elements 154 are integrated into the module in series with capacitors 152, and corrective inductive elements 158 are integrated in series with inductors 156. These corrective elements may have the form of trimmable conductive plates on one of the outer surfaces of the module, as described above. In the case of capacitor C3, as long as one of the metal plates is accessible on the outer surface of the module, there may be no need for an additional corrective element, since the existing plate may simply be trimmed until the desired capacitance is reached.

Other examples of trimmable components and circuits that may be used in embodiments of the present invention are shown and described in the above-mentioned PCT Patent Application PCT/IB2013/053749. (In particular, FIGS. 10-13 in the PCT patent application show trimmable, embedded components that are appropriate for use in such embodiments.) Although certain specific component types and circuits are described above for the sake of clarity and concreteness, the principles of the present invention may similarly be applied in other types of modules, circuits and integrated components.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:
1. An electronic module, comprising:
 a substrate comprising a dielectric material having multiple sides, including first, second and third sides, and first, second and third cavities indented respectively within the first, second and third sides,
 wherein the second side is parallel to and opposite the first side, whereby the first and second cavities open in mutu- ally-opposing directions, while the third side is non-parallel to the first and second sides,
wherein the substrate comprises multiple layers of the dielectric material, which are graduated in size and comprise first and second layers having respective central openings that define the first and second cavities, and
wherein the layers are joined together so as to define the cavities in the substrate, wherein the third cavity is defined by the graduated sizes of the layers;
first, second and third conductive contacts within the first, second and third cavities, configured for contact with at least first, second and third electronic components that are mounted respectively in the first, second and third cavities;
conductive traces within the substrate in electrical communication with the first, second and third conductive contacts; and
a plurality of contact pads disposed on respective exterior surfaces of at least the first and third sides of the substrate and connected to the conductive traces, wherein the contact pads on one of the respective exterior surfaces are configured for contacting a printed circuit board, while the contact pads on the other of the respective exterior surfaces are configured for contacting another module.

2. The module according to claim 1, wherein one or more of the conductive traces and contacts comprise graphene.

3. The module according to claim 1, and comprising a trimmable conductive element formed on a surface of the substrate in proximity to at least one of the cavities, wherein the trimmable conductive element is connected to the conductive traces so as to define an electrical circuit that comprises the first and second electronic components and the trimmable conductive element.

4. The module according to claim 3, wherein the at least one of the cavities is indented within the first side of the substrate, and the surface on which the trimmable conductive element is formed is located on another side of the substrate, different from the first side.

5. The module according to claim 3, wherein the substrate comprises first and second dielectric substrates that are connected together, wherein the trimmable conductive element is formed on the surface of the first dielectric substrate, while the electrical circuit comprises at least one electronic component that is mounted on the second dielectric substrate.

6. The module according to claim 3, wherein the module comprises an array of circuit components embedded in the substrate, and wherein the trimmable conductive element is configured so that trimming the trimmable conductive element disconnects one or more of the circuit components from the array.

7. The module according to claim 3, wherein the module comprises one or more discrete circuit components embedded within the dielectric substrate, and wherein the trimmable conductive element is configured so that trimming the trimmable conductive element adjusts a value of at least one of the embedded components.

8. Apparatus comprising at least first and second modules according to claim 1, which are connected together by contact between the contact pads on the first and second modules.

9. The module according to claim 1, wherein the substrate has a fourth side having a fourth cavity indented therein, wherein the fourth cavity is oriented obliquely relative to the first, second and third sides of the substrate.

10. A method for producing an electronic module, the method comprising:
providing a substrate comprising a dielectric material having multiple sides, including first, second and third sides, and first, second and third cavities indented respectively within the first, second and third sides,
wherein the second side is parallel to and opposite the first side, whereby the first and second cavities open in mutually-opposing directions, while the third side is non-parallel to the first and second sides,
wherein providing the substrate comprises joining together multiple layers of the dielectric material, which are graduated in size and comprise first and second layers having respective central openings that define the first and second cavities, so as to define the cavities in the substrate,
wherein the layers are joined together so as to define the cavities in the substrate, wherein the third cavity is defined by the graduated sizes of the layers,
wherein the substrate has first, second and third conductive contacts within the first, second and third cavities and conductive traces within the substrate in electrical communication with the first, second and third conductive contacts,
wherein a plurality of contact pads are disposed on respective exterior surfaces of at least the first and third sides of the substrate and connected to the conductive traces;
mounting at least first, second and third electronic components in the first, second and third cavities, respectively, in contact with the first, second and third contacts;
connecting the electronic module to another module by contact of the contact pads on one of the respective exterior surfaces with the other module; and
mounting the electronic module on a printed circuit board by contact of the contact pads on the other of the respective exterior surfaces with traces on the printed circuit board.

11. The method according to claim 10, wherein a trimmable conductive element is formed on a surface of the substrate in proximity to at least one of the cavities and is connected to the conductive traces so as to define an electrical circuit that comprises at least one of the first and second electronic components and the trimmable conductive element, and
wherein the method comprises trimming the trimmable conductive element so as to adjust an electrical property of the circuit.

12. The method according to claim 10, wherein the substrate has a fourth side having a fourth cavity indented therein, wherein the fourth cavity is oriented obliquely relative to the first, second and third sides of the substrate.

* * * * *